United States Patent
Lu

(10) Patent No.: US 10,019,236 B2
(45) Date of Patent: Jul. 10, 2018

(54) SRAM-BASED TRUE RANDOM NUMBER GENERATOR

(71) Applicant: Taiwan Semiconductor Manufacturing Co., Ltd., Hsin-Chu (TW)

(72) Inventor: Shih-Lien Linus Lu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 35 days.

(21) Appl. No.: 15/234,842

(22) Filed: Aug. 11, 2016

(65) Prior Publication Data

US 2018/0046436 A1  Feb. 15, 2018

(51) Int. Cl.
    *G06F 7/58*      (2006.01)
    *G11C 11/418*    (2006.01)
    *G11C 11/419*    (2006.01)

(52) U.S. Cl.
    CPC ............ *G06F 7/588* (2013.01); *G11C 11/418* (2013.01); *G11C 11/419* (2013.01)

(58) Field of Classification Search
    CPC ............................................. G06F 7/58–7/588
    USPC ................................................. 708/250–256
    See application file for complete search history.

(56) References Cited

U.S. PATENT DOCUMENTS

| 8,605,523 B2 | 12/2013 | Tao et al. |
| 8,630,132 B2 | 1/2014  | Cheng et al. |
| 8,760,948 B2 | 6/2014  | Tao et al. |
| 8,908,421 B2 | 12/2014 | Liaw |
| 8,929,160 B2 | 1/2015  | Katoch et al. |
| 8,964,492 B2 | 2/2015  | Hsu et al. |
| 8,982,643 B2 | 3/2015  | Lum |
| 9,117,510 B2 | 8/2015  | Yang et al. |
| 9,208,858 B1 | 12/2015 | Lin et al. |
| 9,218,872 B1 | 12/2015 | Liaw |
| 2007/0147156 A1* | 6/2007 | Nishino ................. G11C 29/52 365/226 |
| 2011/0022648 A1* | 1/2011 | Harris ..................... G06F 7/588 708/254 |

(Continued)

FOREIGN PATENT DOCUMENTS

EP            2950201 A1 * 12/2015 ............. G06F 7/588

OTHER PUBLICATIONS

Suresh, V.B., "On-chip True Random Number Generation in Nanometer CMOS," University of Massachusetts Amherst, Department of Electrical and Computer Engineering, Feb. 2012.*

(Continued)

*Primary Examiner* — Matthew Sandifer
(74) *Attorney, Agent, or Firm* — Duane Morris LLP

(57) ABSTRACT

A random number generator (RNG) is disclosed. The RNG comprises a memory bit array having a plurality of bits, wherein each bit is configured to present an initial logic state when the memory bit array is powered on; and a first folding circuit coupled to the memory bit array, wherein the first folding circuit is configured to: read initial logic states of a first bit and a second bit of the memory bit array, perform a first logic function on the initial logic state of the first bit, and perform a second logic function on the initial logic state of the second bit to contaminate the initial logic state of the second bit so as to provide an altered initial logic state of the second bit.

20 Claims, 11 Drawing Sheets

(56) References Cited

U.S. PATENT DOCUMENTS

| | | |
|---|---|---|
| 2014/0040338 A1* | 2/2014 | Van Der Sluis ........ G06F 7/588 708/254 |
| 2014/0153345 A1 | 6/2014 | Kim et al. |
| 2014/0233330 A1 | 8/2014 | Ko et al. |
| 2015/0348598 A1 | 12/2015 | Wang et al. |
| 2015/0371702 A1 | 12/2015 | Wu et al. |
| 2015/0380077 A1 | 12/2015 | Wu et al. |
| 2015/0380078 A1 | 12/2015 | Liaw |

OTHER PUBLICATIONS

D.E. Holcomb, W.P. Burleson, and K. Fu, "Initial SRAM State as a Fingerprint and Source of True Random Numbers for RFID Tags", Proceedings of the Conference on RFID Security, Jul. 2007.*

* cited by examiner

|   | A | B | C | D | E |
|---|---|---|---|---|---|
| a | 1 | 0 | 0 | 1 | X |
| b | X | X | 0 | 0 | 1 |
| c | 1 | 1 | 0 | 0 | 1 |
| d | 0 | 1 | X | 1 | 0 |
| e | 0 | 0 | 1 | X | 1 |

|   | A | B | C | D | E |
|---|---|---|---|---|---|
| a | 1 | 0 | 0 | 1 | X |
| b | X/X | X/X | 0/0 | 0/1 | 1/X |
| c | 1 | 1 | 0 | 1 | 1 |
| d | 0 | 1 | X | 1 | 0 |
| e | 0 | 0 | 1 | X | 1 |

|   | A | B | C | D | E |
|---|---|---|---|---|---|
| a | 1 | 0 | 0 | 1 | X |
| b | X | X | 0 | 0 | 1 |
| c | 1/X | 1/X | 0/0 | 0/1 | 1/X |
| d | 0 | 1 | X | 1 | 0 |
| e | 0 | 0 | 1 | X | 1 |

|   | A | B | C | D | E |
|---|---|---|---|---|---|
| a | 1 | 0 | 0 | 1 | X |
| b | X | X | 0 | 0 | 1 |
| c | 1 | 1 | 0 | 0 | 1 |
| d | 0/X | 1/X | X/X | 1/0 | 0/X |
| e | 0 | 0 | 1 | X | 1 |

SRAM-BASED TRUE RANDOM NUMBER GENERATOR

BACKGROUND

It has become widely recognized that random number generators are fundamentally important in the computer age. Random number generators may be divided into two types: true random number generators, which generate numbers from a non-deterministic source, and pseudorandom number generators, which generate numbers from a deterministic algorithm. A high quality random number generator to generate true random numbers is desirable for cryptographic applications. For example, true random numbers are used as an encryption key for encrypting information and messages.

While pseudorandom number generators are suitably fast for a computer, they cannot generate a true random number because they are generated by algorithms which are deterministic, i.e., they are predictable given knowledge of the algorithm used. On the other hand, instead of relying upon a deterministic algorithm, true random number generators generally use at least one of a variety of physical phenomena (e.g., a thermal noise, an avalanche noise, an optical noise, etc.) as a random number source to generate random numbers. For example, a true number generator may use a thermal noise generated by a resistor, and further amplify the thermal noise as a random voltage source.

Since the physical phenomena being used as a random number source are typically in a non-digital form (e.g., an analog signal, a time-domain signal, etc.), the existing true random number generators are required to use additional circuit(s) to further process information from the random number source from a non-digital form to a digital form. Such further processes may disadvantageously affect a performance of the existing true random number generators, for example, a randomness level of generated random numbers. Thus, the existing random number generators have not been satisfactory in every aspect.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

FIGS. 3A, 3B, 3C, 3D, and 3E each illustrates an example of logic states present at each bit of the SRAM block of FIG. 2, in accordance with some embodiments.

DETAILED DESCRIPTION OF EXEMPLARY EMBODIMENTS

Figure 1:
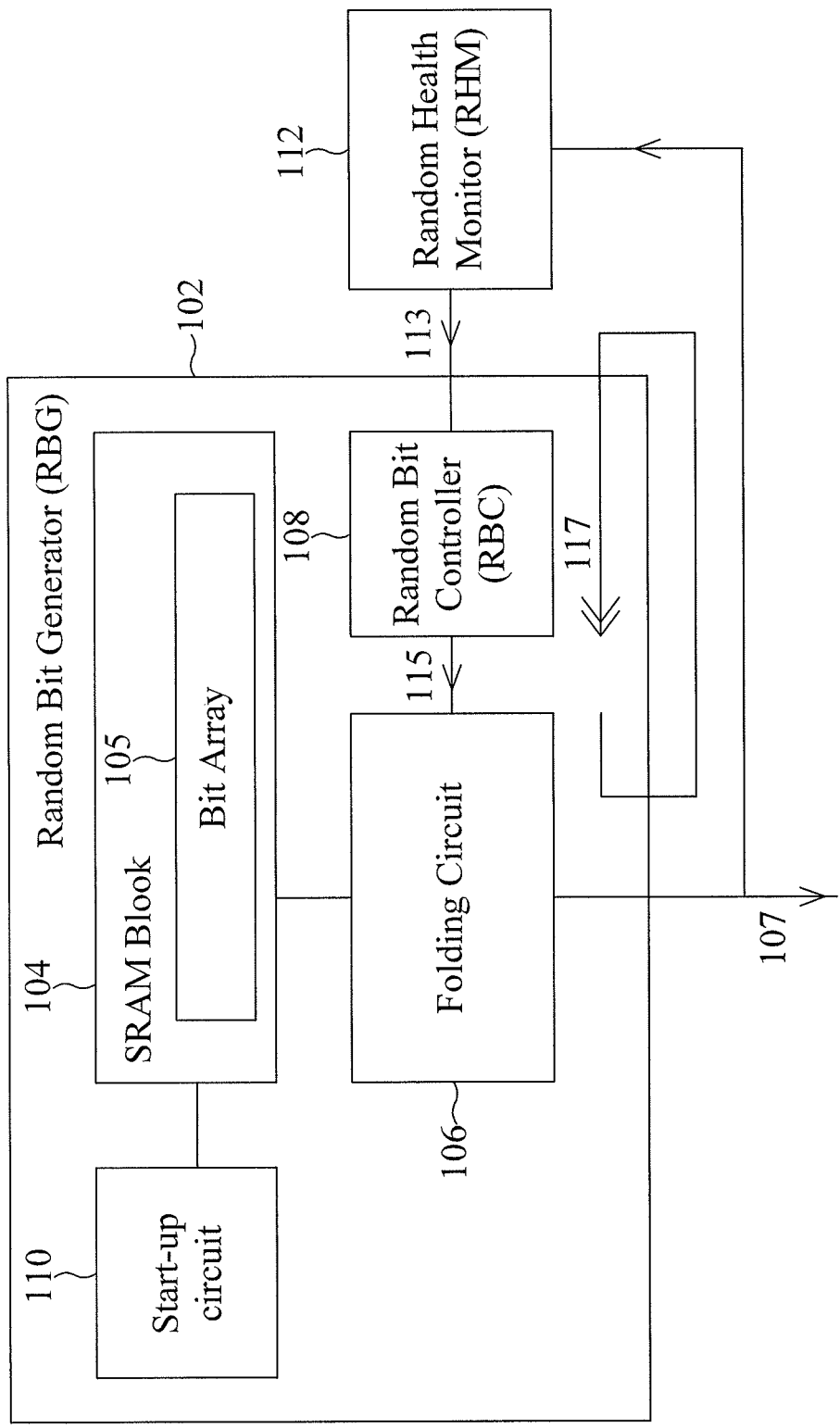
FIG. 1 illustrates an exemplary block diagram of a true random number generator (tRNG), in accordance with various embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

As described above, the existing deterministic RNG's rely upon a deterministic algorithm while true RNG's use additional circuits to process a randomly physical entropy source. In various embodiments of the present disclosure, a true random number generator (tRNG) uses power-on state (s) of a static random-access memory (SRAM) device to generate at least one random number vector. Additionally, a method to operate the tRNG, in accordance with some embodiments, is also disclosed herein. In some embodiments, even though an SRAM device includes symmetric cells (or bits), manufacturing variability may still cause each bit of the SRAM device to tend to be at a high state (i.e., a logical "1") or at a low state (i.e., a logical "0") every time the SRAM device is powered on. Such a power-on state is referred to as an "initial logic state" of the bit, hereinafter.

Further, in some embodiments, bits of an SRAM device are generally constituted of an amount of stable bits and a complementary amount of unstable bits. An unstable bit typically presents a different initial logic state every time the SRAM device is powered on. For example, the unstable bit presents a logical 0 when the SRAM device is initially powered on, and may present a logical 1 when the SRAM device is powered off and subsequently powered on again. The instability of value is due to noises such as the thermal noise. In general, the initial logic state of the unstable bit is unpredictable. On the other hand, the stable bit may present a consistent initial logic state even though the SRAM device is powered on and off many times. That is, the initial logic state of the stable bit is predictable. Typically, stable and unstable bits are randomly distributed across the whole SRAM device, which gives rises to a variability that can be used by the disclosed tRNG to generate random numbers by using the unpredictability of the unstable bits, in accordance with some embodiments. Since the presence of the unstable bit(s) in the SRAM device may cause some malfunctions, reducing the number of unstable bits in the SRAM device is generally a goal in designing/manufacturing the SRAM device. Without compromising such a goal (i.e., keeping the number of unstable bits low), the disclosed tRNG includes a folding circuit that is configured to "virtually contaminate" the stable bit, which generally constitute the majority of bits in the SRAM device, to cause the stable bit to become an unstable bit. As such, the number of unstable bits may be virtually increased. Using the unpredictability of the unstable bit, the increased number of unstable bits may in turn provide a "reliably" nondeterministic source for generating random numbers (or bits). Accordingly, the random numbers (or a random number vector/sequence) generated by using the disclosed tRNG may advantageously have a higher level of "randomness."

FIG. 1 illustrates an exemplary block diagram of a true random number generator (tRNG) 102, in accordance with various embodiments. In the illustrated embodiment of FIG. 1, the tRNG 102 includes an SRAM block 104, a folding circuit 106, a random bit controller (RBC) 108, and a start-up circuit 110. In some embodiments, each of the components (i.e., the SRAM block 104, the folding circuit 106, the RBC 108, and the start-up circuit 110) of the tRNG 102 is coupled with one another. Further, a random health monitor (RHM) 112 is coupled to the tRNG 102, as illustrated in FIG. 1. Although the RHM 112 is illustrated as a separate component from the tRNG 102, in some embodiments, the RHM 112 may be integrated into the tRNG 102 while remaining within the scope of the present disclosure.

As illustrated in FIG. 1, in some embodiments, the SRAM block 104 includes a bit array 105 having a plurality of bits wherein each of the bits is configured to store a logic state (either a logical 1 or a logical 0). As described above, an initial logic state is present at each bit every time the SRAM block 104 is powered on. In some embodiments, the SRAM block 104 is powered on and off by the start-up circuit 110. In some specific embodiments, the start-up circuit 110 may iteratively power on and off the SRAM block 104. The operation of the start-up circuit 110 will be described in further detail below with respect to FIGS. 4A and 4B. The folding circuit 106, coupled to the SRAM block 104, is configured to read the initial logic states of a first set of bits, subsequently read the initial logic states of a second set of bits, and perform a logic function on the initial logic states of the first and second sets of bits so as to provide an altered initial logic state of at least one of the second set of bits, based on the initial logic states of the first set of bits. In some embodiments, the altered initial logic state(s) of the second set of bit(s) may be provided by the tRNG 102 as a random number vector 107. Details of the folding circuit 106 will be described further with respect to FIG. 2.

Referring still to FIG. 1, in some further embodiments, a checking process may be performed to determine a randomness level of the random number vector 107 by using the RHM 112. In some embodiments, the random number vector 107 may be provided by the tRNG 102 as an input signal to the RHM 112. The RHM 112 then determines the generated random number vector 107's randomness level based on a test provided by the National Institute of Standards and Technology (NIST) (see, e.g., http://csrc.nist.gov/groups/ST/toolkit/rng/) and further provides a feedback signal 113 to the RBC 108 of the tRNG 102. Alternatively or additionally, the RHM 112 may be accessed by a user of the tRNG 102 to determine whether the random number vector 107 has a sufficient number of random bits, which may be specified by the user, to provide the feedback signal 113 to the RBC 108 of the tRNG 102. The feedback signal 113 is then used to inform the RBC 108 of an insufficient randomness level, or an insufficient number of random bits, of the random number vector 107. As such, the RBC 108 may cause the folding circuit 106, through a control signal 115, to iteratively read and alter the initial logic states of one or more further sets (e.g., third, fourth, fifth sets, etc.) of bits of the bit array 105 so as to provide one or more updated random number vectors 107 until the RHM 112 determines the randomness level of the updated random number vector 107 being above a pre-defined threshold or the user determines that the random number vector 107 has a sufficient number of random bits. Accordingly, the feedback signal 113, provided by the RHM 112, may be indicative of a sufficient randomness level, or a sufficient number of random bits, of the updated random number vector 107 such that the RBC 108, through the control signal 115, may cause the folding circuit 106 to cease reading and altering the initial logic states of a further set of bits of the bit array 105. In some embodiments, such an iteration 117 (i.e., from 107 to 113 to 115, as shown in FIG. 1) may be repeated any desired number of times or until a sufficient randomness level and/or a sufficient number of random bits are obtained, which will be discussed in further detail below.

Figure 2:
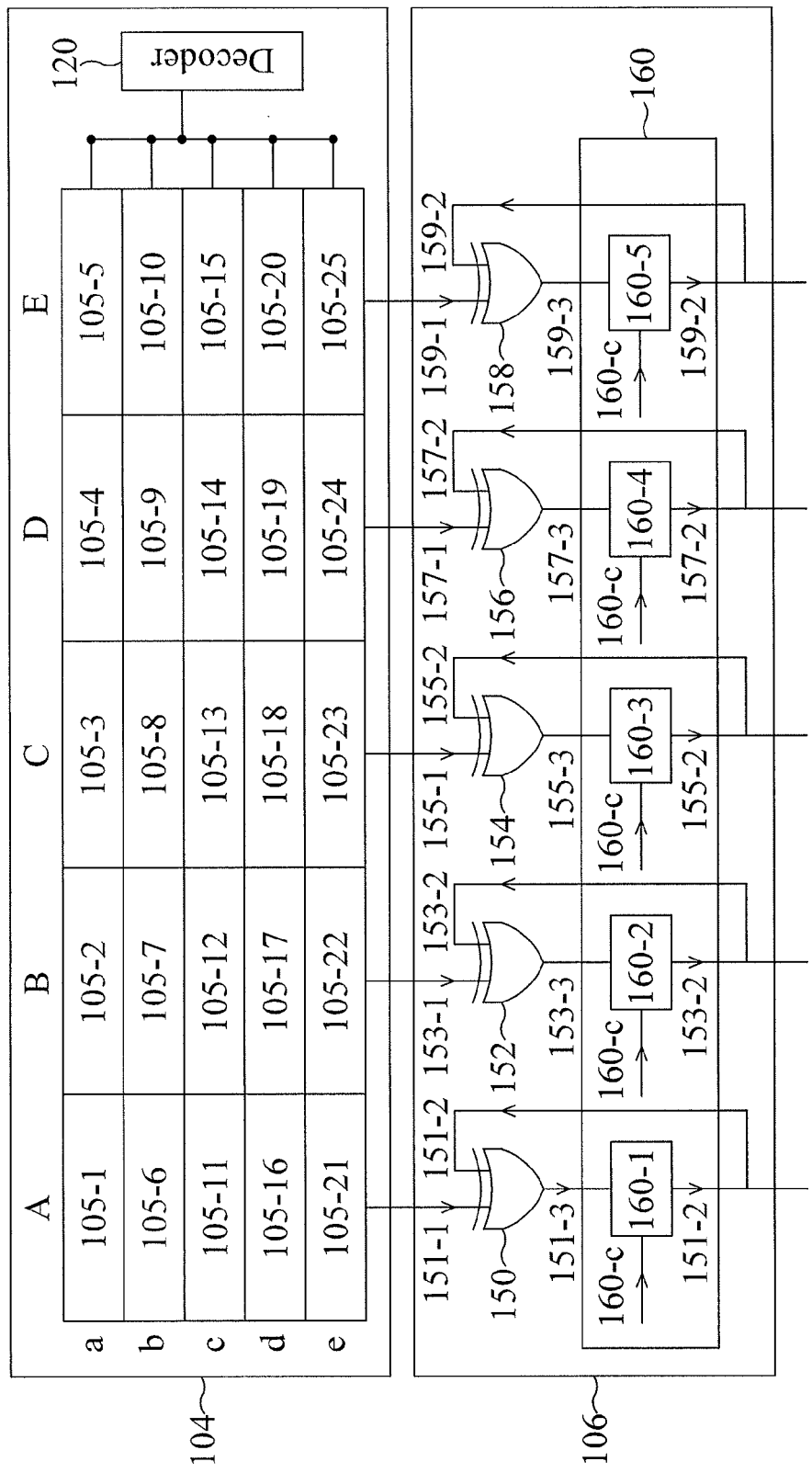
FIG. 2 illustrates an exemplary schematic diagram of an SRAM block and a folding circuit of the tRNG of FIG. 1, in accordance with various embodiments.

FIG. 2 illustrates an exemplary schematic diagram of the SRAM block 104 and the folding circuit 106 of FIG. 1, in accordance with various embodiments. As shown in the illustrated embodiment of FIG. 2, in addition to the bit array 105, the SRAM block 104 includes a decoder whose operation will be described in further detail with respect to FIGS. 3A-3E. The bit array 105 of the SRAM block 104 includes 25 bits: 105-1, 105-2, 105-3, 105-4, 105-5, 105-6, 105-7, 105-8, 105-9, 105-10, 105-11, 105-12, 105-13, 105-14, 105-15, 105-16, 105-17, 105-18, 105-19, 105-20, 105-21, 105-22, 105-23, 105-24, and 105-25. Although only 25 bits are shown in the illustrated embodiment of FIG. 2, any desired number of bits may be included in the embodiment of the bit array 105 while remaining within the scope of the present disclosure.

More specifically, the bits of the bit array 105 may be arranged in a column-row configuration. Bits 105-1 and 105-21, and any other bits disposed therebetween (e.g., 105-6, 105-11, 105-16) are arranged in column "A." Similarly, bits 105-2 and 105-22, and any other bits disposed therebetween (e.g., 105-7, 105-12, 105-17) are arranged in column "B;" bits 105-3 and 105-23, and any other bits disposed therebetween (e.g., 105-8, 105-13, 105-18) are arranged in column "C;" bits 105-4 and 105-24, and any other bits disposed therebetween (e.g., 105-9, 105-14, 105-19) are arranged in column "D;" bits 105-5 and 105-25, and any other bits disposed therebetween (e.g., 105-10, 105-15, 105-20) are arranged in column "E." Although only 5 columns are illustrated in FIG. 2, any desired number of columns may be included in the bit array 105 while remaining within the scope of the present disclosure.

Still more specifically in the bit array 105 of FIG. 2, the bits in each column are each disposed in a respective row, and each row may include a plurality of bits that each belong to a respective, and different column. In the illustrated embodiment of FIG. 2, the bits 105-1, 105-2, 105-3, 105-4, and 105-5 that belong to column A, B, C, D, and E, respectively, are disposed in a same row, hereinafter row "a." Similarly, the bits 105-6, 105-7, 105-8, 105-9, and 105-10 that belong to column A, B, C, D, and E, respectively, are disposed in a same row, hereinafter row "b;" the bits 105-11, 105-12, 105-13, 105-14, and 105-15 that belong to column A, B, C, D, and E, respectively, are disposed in a same row, hereinafter row "c;" the bits 105-16, 105-17, 105-18, 105-19, and 105-20 that belong to column A, B, C, D, and E, respectively, are disposed in a same row, hereinafter row "d;" the bits 105-21, 105-22, 105-23, 105-24, and 105-25 that belong to column A, B, C, D, and E, respectively, are disposed in a same row, hereinafter row "e." Although only 5 rows are illustrated, any desired number of rows may be included in the bit array 105 while remaining within the scope of the present disclosure.

Referring still to FIG. 2, the folding circuit 106 includes a plurality of (electronic) logic gates 150, 152, 154, 156, and 158, and an accumulator register 160 coupled to the plurality of electronic logic gates 150 to 158. More specifically, the accumulator register 160 includes a plurality of latch units 160-1, 160-2, 160-3, 160-4, 160-5, wherein each of the latch units is coupled to a corresponding logic gate. For example, the latch unit 160-1 is coupled to the logic unit 150; the latch unit 160-2 is coupled to the logic gate 152; the latch unit 160-3 is coupled to the logic gate 154; the latch unit 160-4 is coupled to the logic gate 156; the latch unit 160-5 is coupled to the logic gate 158.

More specifically in the illustrated embodiment of FIG. 2, each of the logic gates and its corresponding (coupled) latch unit are coupled to one of the columns of the bit array 105. For example, the logic gate 150 and latch unit 160-1 are coupled to the column A of the bit array 105; the logic gate 152 and latch unit 160-2 are coupled to the column B of the bit array 105; the logic gate 154 and latch unit 160-3 are coupled to the column C of the bit array 105; the logic gate 156 and latch unit 160-4 are coupled to the column D of the bit array 105; the logic gate 158 and latch unit 160-5 are coupled to the column E of the bit array 105. In some embodiments, each of the columns (e.g., column A) of the bit array 105 has a bit line (BL) and/or a bit bar line (BBL), and each of the bits (e.g., bits 105-1, 105-6, 105-11, 105-16, and 105-21) along that column is coupled to the BL and/or BBL of that column. Further, each logic gate may be coupled to the corresponding column of the bit array 105 through the corresponding column's BL and/or BBL. In FIG. 2, the folding circuit 106 includes 5 logic gates and 5 corresponding latch, each corresponding to the 5 columns, respectively, of the bit array 105, as described above. However, in some other embodiments in which the bit array 105 includes less or more than 5 columns, the number of logic gates and the latch units of the folding circuit may be adjusted to correspond to the number of columns of the bit array 105.

In accordance with various embodiments, generally, each of the plurality of logic gates of folding circuit 106 has two input ports and one output port. Further, each logic gate of the folding circuit 106 is configured to perform an "exclusive OR (XOR)" logic function or a "complementary exclusive OR (XNOR)" function on signals received at the two input ports (hereinafter "first input signal" and "second input signal") so as to generate a signal at the output port (hereinafter "XOR'd signal"). Accordingly, in some embodiments, each of the logic gates (e.g., 150, 152, 154, 156 and 158) may be an XOR logic gate (i.e., to perform an XOR function) or an XNOR logic gate (i.e., to perform a XNOR function). Alternatively, in various embodiments, any of a variety of different types of logic gates may be used. Regarding the latch unit of the accumulator register 160, each latch unit has an input port and an output port. More specifically, the input port of each latch unit is coupled to the output port of the latch unit's corresponding logic gate, and the output port of that latch unit is coupled to one of the two input ports of the corresponding logic gate. In some embodiments, the latch unit is configured to latch the signal at the output port of the corresponding logic gate (i.e., the XOR'd signal) to the output port of the latch unit. In other words, the latch unit is configured to temporarily store the XOR'd signal at the output port of the latch unit. The output port of the latch unit is configured to provide the latched (stored) XOR'd signal as an output signal (e.g., part of the random number vector 107) and also as the second input signal of the latch unit's corresponding logic gate. In some embodiments, the output signals provided by the accumulator register 160 (more specifically, the latch units 160-1 to 160-5) may constitute the random number vector 107. The other input port of the latch unit's corresponding logic gate is configured to be coupled to a corresponding column of the bit array 105 such that the other input port of the corresponding logic gate is configured to receive a bit data (e.g., an initial logic state) of a bit along the coupled column of the bit array 105 as the first input signal of the corresponding logic gate, which will be discussed in further detail below.

For example, the logic gate 150 receives its first input signal 151-1 from the column A of the bit array 105 and second input signal 151-2 from the coupled latch unit 160-1, and XOR's the signals 151-1 and 151-2 to provide XOR'd signal 151-3 to the coupled latch unit 160-1. In some embodiments, the first input signal 151-1 may include an initial logic state of at least one of the bits along the column A, that is, bits 105-1, 105-6, 105-11, 105-16, and 105-21. The latch unit 160-1 then latches the XOR'd signal 151-3 as an output signal and also the second input signal 151-2 of the logic gate 150. Similarly, the logic gate 152 receives its first input signal 153-1 from the column B of the bit array 105 and second input signal 153-2 from the coupled latch unit 160-2, and XOR's the signals 153-1 and 153-2 to provide XOR'd signal 153-3 to the coupled latch unit 160-2. In some embodiments, the first input signal 153-1 may include an initial logic state of at least one of the bits along the column B, that is, bits 105-2, 105-7, 105-12, 105-17, and 105-22. The latch unit 160-2 then latches the XOR'd signal 153-3 as an output signal and also the second input signal 153-2 of the logic gate 152. Still similarly, the logic gate 154 receives its first input signal 155-1 from the column C of the bit array 105 and second input signal 155-2 from the coupled latch unit 160-3, and XOR's the signals 155-1 and 155-2 to provide XOR'd signal 155-3 to the coupled latch unit 160-3. In some embodiments, the first input signal 155-1 may include an initial logic state of at least one of the bits along the column C, that is, bits 105-3, 105-8, 105-13, 105-18, and 105-23. The latch unit 160-3 then latches the XOR'd signal 155-3 as an output signal and also the second input signal 155-2 of the logic gate 154. Following the similar description above, the logic gate 156 receives its first input signal 157-1 from one of the bits along the column D of the bit array 105, and second input signal 157-2 from the latch unit 160-4 coupled to logic gate 156. Also, the logic gate 156 XOR's the first and second input signals 157-1 and 157-2 to provide XOR'd signal 157-3 to the latch unit 160-4. Then the latch unit 160-4 latches the XOR'd signal 157-3 as an output signal and also the second input signal 157-2 of the logic gate 156. Regarding the logic gate 158, the logic gate 158 receives its first input signal 159-1 from one of the bits along the column E of the bit array 105, and second input signal 159-2 from the latch unit 160-5 coupled to the logic gate 158. Also, the logic gate 158 XOR's the first and second input signals 159-1 and 159-2 to provide XOR'd signal 159-3 to the latch unit 160-5. Then the latch unit 160-5 latches the XOR'd signal 159-3 as an output signal and also the second input signal 159-2 of the logic gate 158.

In some embodiments, each of the latch units (e.g., 160-1, 160-2, 160-3, 160-4, and 160-5) of the accumulator register 160 may include a D flip flop while any of a variety of latch units (or flip flops) may be used. In the embodiments wherein each of the latch units are implemented as a D flip flop, the D flip flop may further include an input port that is configured to receive a clock signal (e.g., 160-c as shown in FIG. 2). In some embodiments, the clock signal 160-c is used to synchronize the plurality of latch units of the accumulator register 160.

Referring still to FIG. 2 in conjunction with FIG. 1, the operations of the tRNG 102 to generate the random number vector 107 will be discussed at different stages with respect to FIGS. 3A, 3B, 3C, 3D, and 3E, respectively. FIGS. 3A-3E each illustrates an example of logic states (including initial logic states and altered initial logic states, which will be described below) present at each bit of the bit array 105. For clarity, the numeral (e.g., 105-1, 105-2, 105-3, . . . 105-25) of each bit is not shown in FIGS. 3A-3E. In the following discussion, each bit is referred by its corresponding column and row. For example, bit 105-1 is referred to as "bit Aa;" bit 105-2 is referred to as "bit Ba;" bit 105-3 is referred to as "bit Ca;" bit 105-4 is referred to as "bit Da;" bit 105-5 is referred to as "bit Ea;" bit 105-6 is referred to as "bit Ab;" bit 105-7 is referred to as "bit Bb;" bit 105-8 is referred to as "bit Cb;" bit 105-9 is referred to as "bit Db;" bit 105-10 is referred to as "bit Eb;" bit 105-5 is referred to as "bit Ea;" bit 105-6 is referred to as "bit Ab;" bit 105-7 is referred to as "bit Bb;" bit 105-8 is referred to as "bit Cb;" bit 105-9 is referred to as "bit Db;" bit 105-10 is referred to as "bit Eb; bit 105-11 is referred to as "bit Ac;" bit 105-12 is referred to as "bit Bc;" bit 105-13 is referred to as "bit Cc;" bit 105-14 is referred to as "bit Dc;" bit 105-15 is referred to as "bit Ec;" bit 105-16 is referred to as "bit Ad; bit 105-17 is referred to as "bit Bd;" bit 105-18 is referred to as "bit Cd;" bit 105-19 is referred to as "bit Dd;" bit 105-20 is referred to as "bit Ed;" bit 105-21 is referred to as "bit Ae;" bit 105-22 is referred to as "bit Be; bit 105-23 is referred to as "bit Ce;" bit 105-24 is referred to as "bit De;" and bit 105-25 is referred to as "bit Ee."

As described above, the generation of the random number vector 107 is based on one or more alteration (contamination) processes on the initial logic states of the bits of the bit array 105 through XOR'ing (or XNOR'ing) the initial logic states of the bits. In this regard, according to some embodiments, the SRAM block 104 (more specifically, the bit array 105) is powered on by the start-up circuit 110. Once the bit array 105 is powered on, each bit of the bit array 105 presents an initial logic state, i.e., either a logical 1 or 0. Referring to FIG. 3A, for example, the bits Aa, Ba, Ca, Da, and Ea on row "a" may present initial logic states: 1, 0, 0, 1 and X, respectively, where a logic state of "X" refers to an unstable bit.

Figure 3B:

In the illustrated embodiment of FIG. 3A and the following discussion (FIGS. 3B-3E), when a bit presents either an 1 or a 0 (e.g., bits Aa, Ba, Ca, Da), the bit is referred to as a stable bit; when a bit presents an X (e.g., bit Ea), the bit is referred to as an unstable bit. As described above, the initial logic state of such an unstable bit (e.g., bit Ea) is unpredictable so that, for example, the initial logic state of the bit Ea may sometimes be a 1 or sometimes be a 0. As further shown in the FIG. 3A, the bits Ab, Bb, Cb, Db, and Eb along row b may present initial logic states: X, X, 0, 0, 1, respectively; the bits Ac, Bc, Cc, Dc, and Ec along row c may present initial logic states: 1, 1, 0, 0, 1, respectively; the bits Ad, Bd, Cd, Dd, and Ed along row d may present initial logic states: 0, 1, X, 1, 0, respectively; the bits Ae, Be, Ce, De, and Ee along row e may present initial logic states: 0, 0, 1, X, 1, respectively.

Continuing with the discussion of the operations of the tRNG 102, according to various embodiments, the initial logic states of a first set of bits are first read by the folding circuit 106, and, subsequently, the initial logic states of a second set of bits are read by the folding circuit 106. More specifically, in some embodiments, the logic gates of the folding circuit 106 may perform such read operations. In some embodiments, the first set of bits may include the bits along a first row, and the second set of bits may include the bits along a second row in the following discussion. The selection of the first row and subsequent selection of the second row may be determined and performed by the decoder 120 (FIG. 2) of the SRAM block 104. In some embodiments, the decoder 120 may include a column and/or a row decoder. More specifically, in an example of the decoder 120 being a row decoder, the row decoder 120 may select a row by using a control signal to assert a signal line (e.g., a word line) that is associated with that row.

Continuing with the example discussed above, row a may be selected first by the row decoder 120. As such, the initial logic state of each of the bits along row a is read by the respectively coupled logic gate of the folding circuit 106. As described above and illustrated in the embodiment of FIG. 2, each column (A, B, C, D, and E) of the bit array 105 is coupled to a logic gate of the folding circuit 106, and more specifically, the initial logic state of each of the bits along that column may serve as the first input signal to the coupled logic gate. Thus, the initial logic states of the bits along row a may be read/received (as the first input signals) by the logic gates 150, 152, 154, 156, and 158, respectively. For example, the first input signals 151-1, 153-1, 155-1, 157-1, and 159-1 may be presented as 1, 0, 0, 1, X, which are also the initial logic states of the bits Aa, Ba, Ca, Da, and Ea, respectively.

Before reading the initial logic states of the second set (e.g., the second row) of bits, in some embodiments, each of the logic gates of the folding circuit 106 may perform the XOR function (or XNOR function) on the first and second input signals of each respective logic gate. In the above example, for each logic gate, only the first input signal presents a logic state, so that, in some embodiments, the second signals 151-2, 153-2, 155-2, 157-2, and 159-2 may each initially have a NULL state (e.g., a 0). In some embodiments, two XOR'd inputs will provide an output in accordance with the truth table shown in Table 1 below.

TABLE 1

| Input 1 | Input 2 | Output |
| --- | --- | --- |
| 0 | 0 | 0 |
| 1 | 1 | 0 |
| 0 | 1 | 1 |
| 1 | 0 | 1 |

After each of the logic gates generates the XOR'd signal, the corresponding latch unit latches such an XOR'd signal as the output signal (to constitute the random number vector 107) and also provides the latched signal as the second input signal to the corresponding logic gate, as described above. Thus, in the above example, the output signals 151-2, 153-2, 155-2, 157-2, and 159-2 of the latch units 160-1, 160-2, 160-3, 160-4, and 160-5, and the second input signals 151-2, 153-2, 155-2, 157-2, and 159-2 of the logic gates 150, 152, 154, 156, and 158 may be presented as: 1, 0, 0, 1, and X, respectively, as illustrated in FIG. 3A.

In some embodiments, subsequent to transitions of the second input signals of the logic gates (e.g., from the NULL state to 1, 0, 0, 1, and X in the above example) or upon the second input signals of the logic gates being provided by the respectively coupled latch units, the row decoder 120 may then select the second row of the bit array to be read. Continuing with the same example provided above, row b is selected by the row decoder 120. Consequently, referring still to FIG. 3A, the initial logic states of the bits along row b (i.e., bits Ab, Bb, Cb, Db, and Eb) are read by the logic gates of the folding circuit 106. As such, the first input signals 151-1, 153-1, 155-1, 157-1, and 159-1 of the logic gates 150, 152, 154, 156, and 158 are presented as: X, X, 0, 0, 1, respectively.

Following the operation discussed above, each of the logic gates performs the XOR function (using the truth table of Table 1) on its first and second input signals to provide an XOR'd signal. Using the same example, the logic gate 150 provides the XOR'd signal 151-3 as an X by performing the XOR function on the first and second input signals 151-1 (i.e., the initial logic state of the bit Ab: X) and 151-2 (i.e., the latched output from the previous XOR operation: 1). Similarly, the logic gate 152 provides the XOR'd signal 153-3 as an X by performing the XOR function on the first and second input signals 153-1 (i.e., the initial logic state of the bit Bb: X) and 153-2 (i.e., the latched output from the previous XOR operation: 0); the logic gate 154 provides the XOR'd signal 155-3 as a 0 by performing the XOR function on the first and second input signals 155-1 (i.e., the initial logic state of the bit Cb: 0) and 155-2 (i.e., the latched output from the previous XOR operation: 0); the logic gate 156 provides the XOR'd signal 157-3 as an 1 by performing the XOR function on the first and second input signals 157-1 (i.e., the initial logic state of the bit Db: 0) and 157-2 (i.e., the latched output from the previous XOR operation: 1); the logic gate 158 provides the XOR'd signal 151-3 as an X by performing the XOR function on the first and second input signals 159-1 (i.e., the initial logic state of the bit Eb: 1) and 159-2 (i.e., the latched output from the previous XOR operation: X). The resultant XOR'd signals 151-3, 153-3, 155-3, 157-3, and 159-3, which constitute altered initial logic states, are then latched by respective latch units 160-1, 160-2, 160-3, 160-4, 160-5 and provided as the output signals 151-2, 153-2, 155-2, 157-2, and 159-2. The output signals 151-2, 153-2, 155-2, 157-2, and 159-2 are also provided as the second input signals to the respective logic gates to perform further XOR functions on a subsequent row (e.g., rows c, d, e, etc.). As shown in FIG. 3B, the resultant XOR'd signals (altered initial logic states) provided as output signals 151-2, 153-2, 155-2, 157-2, and 159-2 are: X, X, 0, 1, X, respectively. Note that the initial logic states of the bits along row b are still X, X, 0, 0, 1 (FIGS. 3A and 3B), but the altered initial logic states (XOR'd signals) of the bits along row b are X, X, 0, 1, X (FIG. 3B). More specifically, the stability of the bit Eb changes virtually (i.e., becoming an unstable bit virtually). In some embodiments, such an alteration of the stability for a bit is referred to as a "contamination" process for the bit. The principle of the contamination process is described in further detail as follows.

As described above, X is referred to as the initial logic state of the unstable bit. X may sometimes be a 0 and may sometimes be a 1, i.e., an unpredictable initial logic state. On the other hand, the initial logic state of the stable bit is always either an 1 or a 0, i.e., a predictable initial logic state.

Thus, when an unpredictable initial logic state is XOR'd with a predictable initial logic state, the XOR'd result becomes unpredictable as well. For example, based on the truth table of the XOR function as shown in Table 1, an unpredictable X (sometimes an 1, sometimes an 0) XOR'ing with a predictable 0 may sometimes output an 1 (when X is an 1) and sometimes output an 0 (when X is an 0).

Following the above-described principle, when a logic gate performs the XOR function on the initial logic states of a stable bit (having a predictable initial logic state) and an unstable bit (having an unpredictable initial logic state), the result (i.e., the XOR'd output) is an unstable bit since the resultant initial logic state now becomes unpredictable. Consequently, when a stable bit is XOR'd by the folding circuit 106 with an unstable bit, the stable bit may be "contaminated" by the unstable bit and become an unstable bit.

Referring again to FIG. 3B in conjunction with FIG. 2, the folding circuit 106 virtually contaminates the stability of the bits along row b by XOR'ing the initial logic states of the bits along row b with the initial logic states of the bits along row a. More specifically, the folding circuit 106 virtually contaminates the stability of the bit Eb on row b by XOR'ing the unpredictable initial logic state of the bit Ea on row a with the predictable initial logic state of the bit Eb on row b. As shown in FIG. 3B, the output signals 151-2, 153-2, 155-2, 157-2, and 159-2 resulting from XOR'ing the bits of row b are: X, X, 0, 1, X. Consequently, one contamination process has been performed by the folding circuit 106. In the following discussion, the contamination process on row b using row a is referred to as the "first contamination process."

In some embodiments, referring back to FIGS. 1 and 2, the folding circuit 106 may provide the output signals 151-2, 153-2, 155-2, 157-2, and 159-2 as the random number vector 107 without further iteration(s) through the RHM 112 and the RBC 108 (e.g., 117). In other words, in such an embodiment, one contamination process (e.g., the first contamination process on row b using row a) is performed by the folding circuit 106. In some other embodiments, the folding circuit 106 may continue to perform one or more contamination processes iteratively until either a desired number of random bits in the random number vector 107 is achieved (or exceeded) or the randomness level of the random number vector 107 is approved/accepted by the NIST test. In some embodiments, when the folding circuit 106 provides the output signals 151-2, 153-2, 155-2, 157-2, and 159-2 (i.e., X, X, 0, 1, X) as the random number vector 107 after the first contamination process, the number of random bits in this random number vector 107 is 3 (i.e., the 3 unstable bits are considered as random bits, respectively). If the desired number of random bits is 2 (specified by a user of the tRNG 102, for example), the number of random bits in this random number vector 107 (i.e., 3) exceeds the desired number of random bits (i.e., 2). As such, the user may use the random number vector 107 and cease performing any further contamination processes. On the other hand, if the number of random bits in the random number vector 107 does not meet or exceed the desired number, the user may follow the iteration 117 (FIG. 1) to cause the folding circuit 106 to perform one or more contamination processes. In some embodiments, the user may access the RHM 112 to perform the above-described operations (e.g., the iteration 117). In some embodiments, the RHM 112 may use the test provided by the NIST (as described above) to determine whether the random number vector 107 passes the test. If the random number vector 107 passes the NIST randomness test, the RHM 112 may cause the folding circuit 106 to cease contaminating more bits. If it fails, the RHM 112 may also follow the iteration 117 to cause the folding circuit 106 to contaminate more bits.

FIGS. 3C, 3D, and 3E illustrate output signals 151-2, 153-2, 155-2, 157-2, and 159-2 after second, third, and fourth contamination processes, respectively. More specifically, as illustrated in FIG. 3C, the second contamination process includes XOR'ing the initial logic states of the bits along row c using the altered logic initial states of the bits along row b (i.e., the output signals 151-2, 153-2, 155-2, 157-2, and 159-2: X, X, 0, 1, X, as shown in FIG. 3B). Similarly, as illustrated in FIG. 3D, the third contamination process includes XOR'ing the initial logic states of the bits along row d using the altered logic initial states of the bits along row c (i.e., the output signals 151-2, 153-2, 155-2, 157-2, and 159-2: X, X, 0, 1, X, as shown in FIG. 3C); as illustrated in FIG. 3E, the fourth contamination process includes XOR'ing the initial logic states of the bits along row e using the altered logic initial states of the bits along row d (i.e., the output signals 151-2, 153-2, 155-2, 157-2, and 159-2: X, X, X, 0, X, as shown in FIG. 3D). Details of the contamination processes of FIGS. 3C, 3D, and 3E will be respectively provided in detail below.

Referring now to FIG. 3C, after the first contamination process, the output signals 151-2, 153-2, 155-2, 157-2, and 159-2 (and also the second input signals of the logic gates 150, 152, 154, 156, and 158, respectively) are the altered initial logic states of the bits along row b. Such second input signals will be used by the respective logic gates 150, 152, 154, 156, and 158, in the second contamination process, to perform the XOR function on the initial logic states of the bits along row c. For the purpose of illustration, in FIG. 3C, in addition to the initial logic states of the bits along row b being shown (above the slash), the output signals 151-2, 153-2, 155-2, 157-2, and 159-2 from the first contamination process (i.e., the second input signals of the logic gates 150, 152, 154, 156, and 158, respectively) are also shown on row b (below the slash). In some embodiments, the row decoder 120 (FIG. 2) next selects row c to be read by the folding circuit 106. Accordingly, following the operation described above, the first input signals of the logic gates 150, 152, 154, 156, and 158 of the folding circuit 106 are the initial logic states of the bits along row c, which are: 1, 1, 0, 0, and 1, as shown in FIGS. 3A-3C. Through XOR'ing the respective first and second input signals by the logic gates 150, 152, 154, 156, and 158, XOR'd signals 151-3, 153-3, 155-3, 157-3, and 159-3 of the logic gates 150, 152, 154, 156, and 158 are presented as, X, X, 0, 1, and X. As described above, the XOR'd signals 151-3, 153-3, 155-3, 157-3, and 159-3 are then respectively latched by the latch units 160-1, 160-2, 160-3, 160-4, and 160-5 as the output signals 151-2, 153-2, 155-2, 157-2, and 159-2, i.e., X, X, 0, 1, and X, as shown in FIG. 3C and also provided as the second input signals of the logic gates 150, 152, 154, 156, and 158, respectively, for a third contamination process, if necessary.

Referring now to FIG. 3D, after the second contamination process, the output signals 151-2, 153-2, 155-2, 157-2, and 159-2 (and also the second input signals of the logic gates 150, 152, 154, 156, and 158, respectively) are the altered initial logic states (below slash) of the bits along row c. Such second input signals will be used by the respective logic gates 150, 152, 154, 156, and 158, in the third contamination process, to perform the XOR function on the initial logic states of the bits along row d. For the purpose of illustration, in FIG. 3D, in addition to the initial logic states of the bits along row c being shown (above the slash), the output signals 151-2, 153-2, 155-2, 157-2, and 159-2 from the second contamination process (i.e., the second input signals of the logic gates 150, 152, 154, 156, and 158, respectively) are also shown on row c (below the slash). In some embodiments, the row decoder 120 (FIG. 2) then selects row d to be read by the folding circuit 106. Accordingly, following the similar operation described above, the first input signals of the logic gates 150, 152, 154, 156, and 158 of the folding circuit 106 are the initial logic states of the bits along row d, which are: 0, 1, X, 1, and 0, as shown in FIGS. 3A-3D. Through XOR'ing the respective first and second input signals by the logic gates 150, 152, 154, 156, and 158, XOR'd signals 151-3, 153-3, 155-3, 157-3, and 159-3 of the logic gates 150, 152, 154, 156, and 158 are presented as, X, X, X, 0, and X. As described above, the XOR'd signals 151-3, 153-3, 155-3, 157-3, and 159-3 are then respectively latched by the latch units 160-1, 160-2, 160-3, 160-4, and 160-5 as the output signals 151-2, 153-2, 155-2, 157-2, and 159-2, i.e., X, X, X, 0, and X, as shown in FIG. 3D and also provided as the second input signals of the logic gates 150, 152, 154, 156, and 158, respectively, for a fourth contamination process, if necessary.

Referring now to FIG. 3E, after the third contamination process, the output signals 151-2, 153-2, 155-2, 157-2, and 159-2 (and also the second input signals of the logic gates 150, 152, 154, 156, and 158, respectively) are the altered initial logic states (below slash) of the bits along row d. Such second input signals will be used by the respective logic gates 150, 152, 154, 156, and 158, in the fourth contamination process, to perform the XOR function on the initial logic states of the bits along row e. For the purpose of illustration, in FIG. 3E, in addition to the initial logic states of the bits along row d being shown (above the slash), the output signals 151-2, 153-2, 155-2, 157-2, and 159-2 from the third contamination process (i.e., the second input signals of the logic gates 150, 152, 154, 156, and 158, respectively) are also shown on row d (below the slash). Referring back to FIG. 2, in some embodiments, the row decoder 120 continues to select row e to be read by the folding circuit 106. Accordingly, following the similar operation described above, the first input signals of the logic gates 150, 152, 154, 156, and 158 of the folding circuit 106 are the initial logic states of the bits along row e, which are: 0, 0, 1, X, and 1, as shown in FIGS. 3A-3E. Through XOR'ing the respective first and second input signals by the logic gates 150, 152, 154, 156, and 158, XOR'd signals 151-3, 153-3, 155-3, 157-3, and 159-3 of the logic gates 150, 152, 154, 156, and 158 are present as, X, X, X, X, and X. As described above, the XOR'd signals 151-3, 153-3, 155-3, 157-3, and 159-3 are then respectively latched by the latch units 160-1, 160-2, 160-3, 160-4, and 160-5 as the output signals 151-2, 153-2, 155-2, 157-2, and 159-2, i.e., X, X, X, X, and X, as shown in FIG. 3E. In some embodiments, the output signals 151-2, 153-2, 155-2, 157-2, and 159-2 are provided by the tNRG 102 as the random number vector 107.

In the above example, the random number vector 107 can include the (altered) initial logic states of X, X, X, X, X (i.e., 5 unstable bits). As described above, the initial logic state of an unstable bit is unpredictable so each unstable bit may serve as a random bit source. Accordingly, 5 random bits (in the random number vector 107) can be provided by the tRNG 102 after the folding circuit 106 performs four contamination processes, as described above. In the example above, combining an initial XOR process and four subsequent contamination processes, a total five XOR'ing processes, resulted in 5 random (i.e., unstable) bits. In accordance with various embodiments of the present disclosure, the above-described XOR'ing process is referred to herein as a "folding cycle."

As described above, if the number of random bits in the random number vector 107 provided by the tRNG 102 exceeds or meets the desired number of random bits specified by the user of the tRNG 102, the provided random number vector 107 may be accepted by the user and no further folding cycle may be performed. In the above example, if the number of random bits specified by a user (of the tRNG 102) is 5 or less, the random number vector 107 with 5 random bits (after 5 folding cycles) may be accepted by the user. However, in some embodiments, one or more folding cycles may be needed to meet or exceed a desired number of random bits specified by a user of the tRNG 102. Referring first to the above-provided example, as illustrated in FIG. 3A, there are 5 unstable bits (before any contamination process) out of a total 25 bits in the bit array 105, i.e., 20% unstable bits in the bit array 105. In another example, if the bit array 105 includes 100 bits arranged by 20 rows and 5 columns, and 5% unstable bits out of the 100 bits (before being contaminated), the folding circuit 106 may use more than 5 folding cycles to achieve 5 random bits, for example, 20 or more folding cycles.

As described above, in some embodiments, the start-up circuit 110 may iteratively power on and off (hereinafter "a power cycle") the SRAM block 104 every time a set of initial logic states (e.g., the initial logic states of the bits along row a, b, c, d, e of FIG. 2) to be read by the folding circuit 106. Through such iterative power cycles, the randomness level (or the number of random bits) of the random number vector 107, provided by the tRNG 102, may be advantageously increased. In order to improve an operation speed of the tRNG 102 (i.e., reducing the latency between power cycles), a time interval between subsequent power cycles may be specified by the start-up circuit 110. However, when the start-up circuit 110 powers on the SRAM block 104 before the SRAM block 104 is fully discharged (during a power off phase of one power cycle), a variety of issues may occur such as, for example, the randomness level of the provided random number vector 107. To address such issues, the tRNG 102 in the present disclosure provides some embodiments of the start-up circuit 110 that can provide an improved latency without compromising the randomness level of the random number vector 107.

Figure 4A:
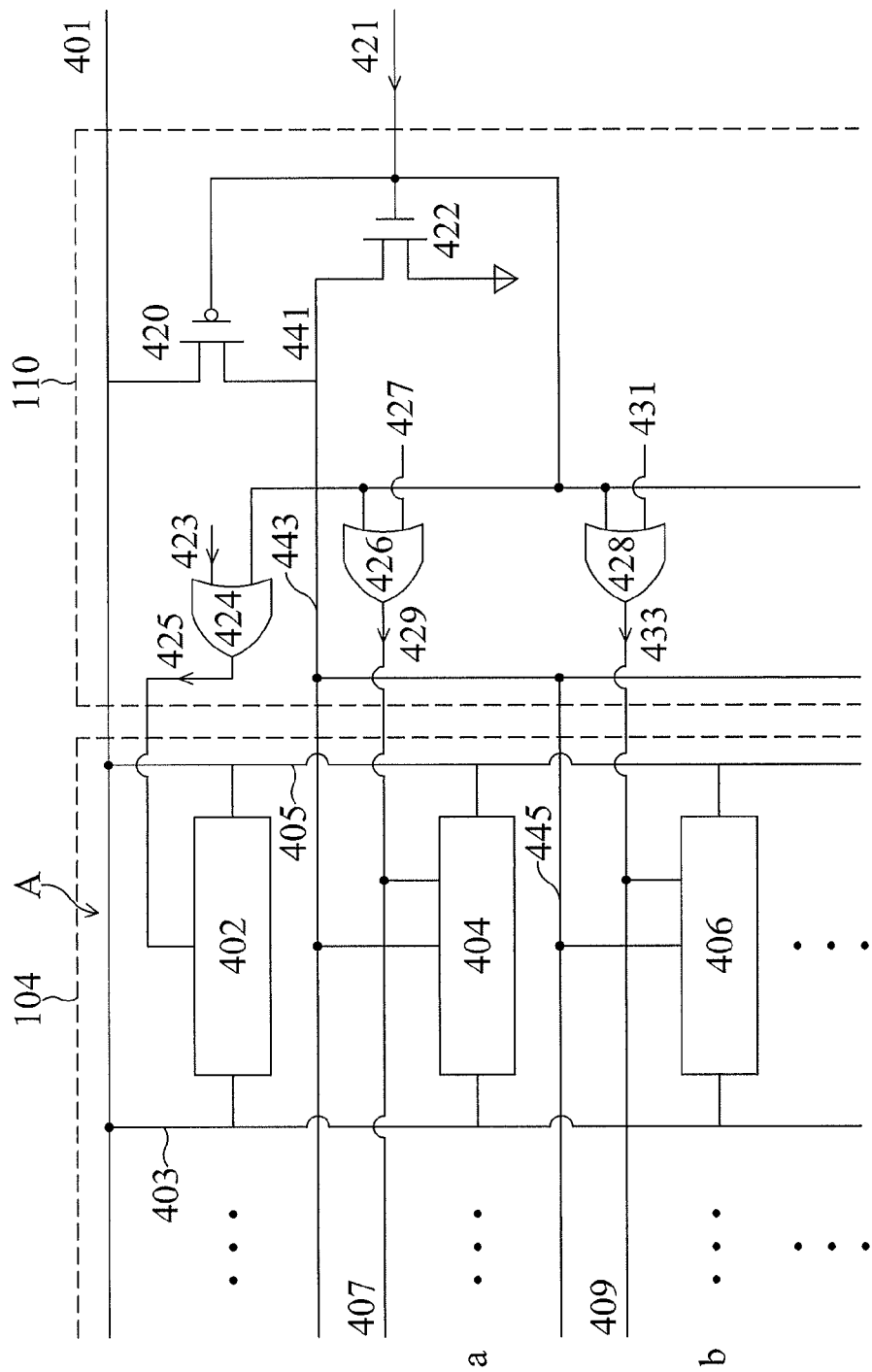
FIG. 4A illustrates an exemplary schematic diagram illustrating part of an SRAM block and part of a start-up circuit of the tRNG of FIG. 1, in accordance with various embodiments.
Figure 4B:
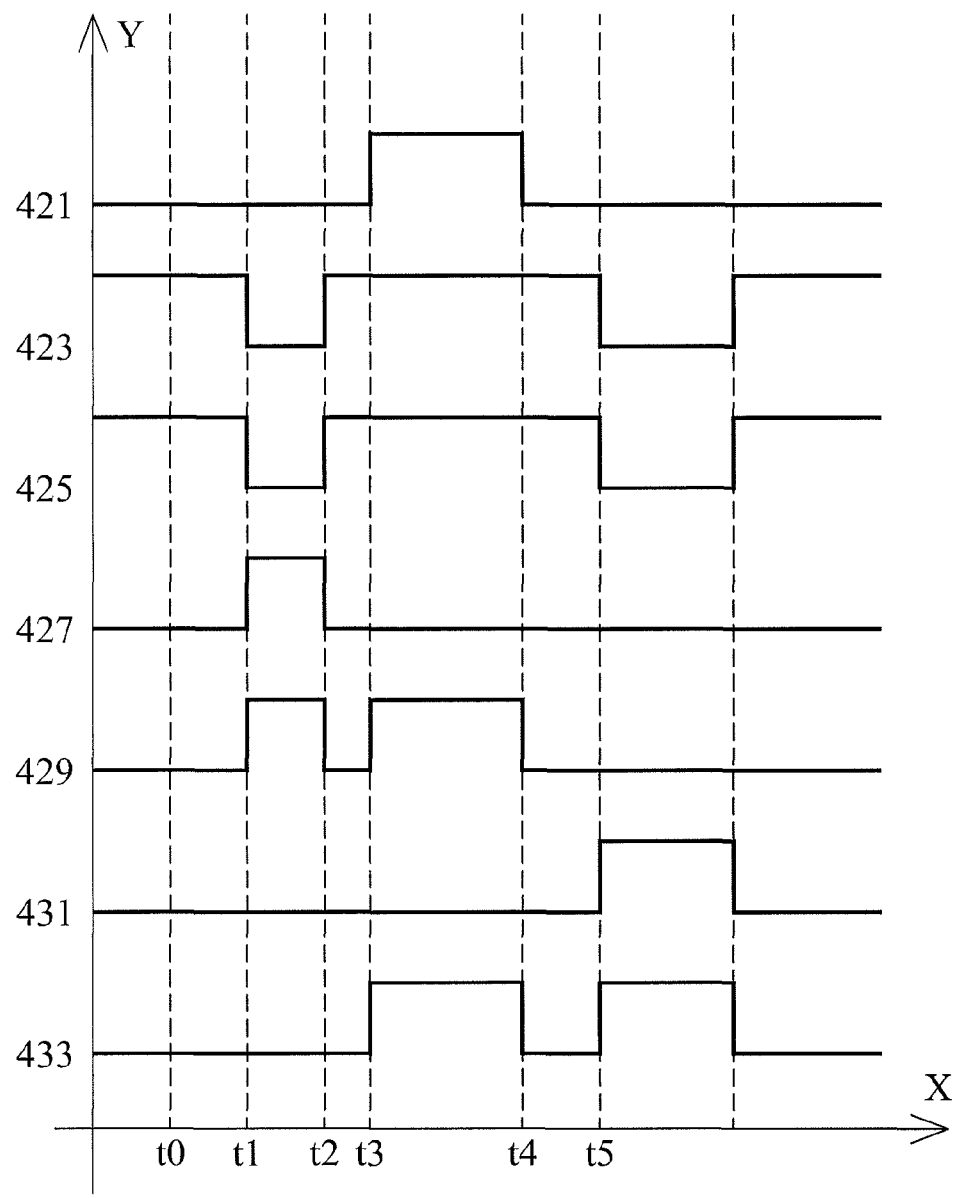
FIG. 4B illustrates exemplary waveforms of signals to operate the start-up circuit of FIG. 4A, in accordance with some embodiments.

Referring now to FIGS. 4A and 4B, FIG. 4A is an exemplary schematic diagram illustrating part of the SRAM block 104 (FIG. 1) and part of the start-up circuit 110 (FIG. 1), in accordance with various embodiments. Since FIG. 4A is provided for the purpose of illustration, only part of the SRAM block 104 (1 column and 2 rows) and part of the start-up circuit 110 (corresponding to the partially shown SRAM block 104) are illustrated in FIG. 4A. FIG. 4B illustrates exemplary waveforms of signals to operate the SRAM block 104 and start-up circuit 110 of FIG. 4A, in accordance with various embodiments.

In the illustrated embodiment of FIG. 4A, the SRAM block 104 includes a pre-charge circuit 402, a first bit (or cell) 404, and a second bit (or cell) 406. In some embodiments, the first and second bits, 404 and 406, are part of the bit array 105. Still in some embodiments, the embodiment of the SRAM block 104 in FIG. 4A is substantially similar to the embodiment with respect to FIG. 2. That is, bits are arranged in a column-row configuration; each column has a bit line (BL) and/or a bit bar line (BBL) coupled to the bits arranged in that column; each row has a word line (WL) coupled to the bits arranged in that row. As described above, only two rows and one column are shown in FIG. 4A, and thus only two bits 404 and 406 are shown. The SRAM block 104 of FIG. 4A may include any desired number of columns and rows, and each column/row may include any desired number of bits that still remains within the scope of the present disclosure. More specifically in the embodiment of FIG. 4A, the first and second bits, 406 and 406, are arranged at a same column "A;" column A includes BL 403 and BBL 405 that are coupled to the bits 404 and 406, respectively; the bits 404 and 406 are arranged at rows "a" and "b," respectively; and rows a and b include WL's 407 and 409 coupled to the bit 404 and 406, respectively. Further, in this specific embodiment of FIG. 4A, the pre-charge circuit 402 is disposed at column A as well. The pre-charge circuit 402 is coupled to the bits 404 and 406 through the BL 403 and BBL 405. The pre-charge circuit 402 is configured to receive pre-charge control signal 425 so as to pre-charge the BL 403 and BBL 405 to a voltage level of supplied voltage 401 (e.g., Vdd) before a logic state (e.g., an initial logic state) is read out from the bit, which will be discussed in further detail below. In some alternative embodiments, the pre-charge circuit 402 may be implemented as a "discharge" circuit that is configured to discharge the BL 403 and BBL 405 to ground before a logic state (e.g., an initial logic state) is read out from the bit.

Referring still to FIG. 4A, the start-up circuit 110 includes a first transistor 420, a second transistor 422, a first logic gate 424, a second logic gate 426, and a third logic gate 428. In some embodiments, the first logic gate 424 is configured to control the pre-charge circuit 402; the second logic gate 426 is configured to control the bit 404; the third logic gate 428 is configured to control the bit 406, and thus, accordingly, only three logic gates are shown in FIG. 4A. Following the embodiment in which the SRAM block 104 includes more columns/rows (i.e., 2 rows and 1 column), the start-up circuit 110 may include any corresponding number of logic gates while remaining within the scope of the present disclosure. In some embodiments, the first transistor 420 is a p-type metal-oxide-semiconductor (PMOS) transistor, the second transistor 422 is an n-type metal-oxide-semiconductor (NMOS) transistor, and the first, second, and third logic gates are OR gates. In some other embodiments, the first and second transistors 420 and 422 may be respectively any of a variety of transistors, for example, a bipolar junction transistor (BJT), a high-electron mobility transistor (HEMT), a silicon-on-insulator (SOI) transistor, etc., that are suitable to perform a switching function, as will be described below.

In the embodiment illustrated in FIG. 4A, the source of the first transistor 420 is coupled to the supplied voltage 401, the gate of the first transistor 420 is coupled to a power signal line that is configured to receive a power signal 421, the drain of the first transistor 420 is coupled to the drain of the second transistor 422 at a common node 441, the gate of the second transistor 422 is also coupled to the power signal line that is configured to receive the power signal 421, and the source of the second transistor 422 is coupled to ground. The common node 441 is coupled to at least two virtual supplied voltage (VSV) lines 443 and 445. The VSV lines 443 and 445 are coupled to the bits 404 and 406, respectively. In some embodiments, each of the OR logic gates, 424, 426, and 428, is configured to receive two input signals, and performs an OR function, as shown in Table 2, on the respective two input signals, to provide an output signal.

TABLE 2

| Input 1 | Input 2 | Output |
|---------|---------|--------|
| 0 | 0 | 0 |
| 1 | 1 | 1 |
| 0 | 1 | 1 |
| 1 | 0 | 1 |

In the illustrated embodiment of FIG. 4A, OR logic gate 424 is configured to OR (i.e., perform the OR function) a pre-charge signal 423 and the power signal 421 so as to provide the pre-charge control signal 425 (i.e., an OR'd signal) to the pre-charge circuit 402; OR logic gate 426 is configured to OR a WL signal 427 and the power signal 421 so as to provide a WL assertion signal 429 (i.e., an OR'd signal) to the bit 404; OR logic gate 428 is configured to OR a WL signal 431 and the power signal 421 so as to provide a WL assertion signal 433 (i.e., an OR'd signal) to the bit 406.

Referring now to FIG. 4B, waveforms of the power signal 421, the pre-charge signal 423, the pre-charge control signal 425, the WL signal 427, and the WL assertion signal 429 are illustrated, respectively, in accordance with various embodiments. In the illustrated embodiment of FIG. 4B, each of the waveforms (signals) varies between a logical high state, hereinafter "high," and a logical low state, hereinafter "low," (along the Y axis in FIG. 4B) over time (along the X axis in FIG. 4B).

Starting from "t0," the power signal 421 is at low; the WL signals 427 and 431 are at low; the pre-charge signal 423 is at high. Consequently, using the truth table of OR function in Table 2, the pre-charge control signal 425 (i.e., OR'ing signals 421 and 423) is at high; the WL assertion signals 429 and 433 (i.e., OR'ing signals 421 and 427 and OR'ing signals 421 and 431, respectively) are at low. When the power signal 421 is at low, the first transistor 420 is on and the second transistor 422 is off. As such, the first transistor 420 couples the supplied voltage 401 (Vdd) to the VSV lines 443 and 445 so as to provide the Vdd (i.e., power) to the bits 404 and 406. That is, the bits 404 and 406 are powered on. When the pre-charge control signal 425 is at high, in this specific embodiment, the pre-charge circuit 402 is deactivated. Accordingly, the pre-charge circuit 402 does not couple (pre-charge) the supplied voltage (Vdd) to the BL 403 and BBL 405. That is, the BL 403 and BBL 405 are not pre-charged. When the WL assertion signal 429 is at low, the WL 407 is not asserted, which mean that the bit 404 is not selected (despite being powered on). Similarly, when the WL assertion signal 433 is at low, the WL 409 is not asserted, which mean that the bit 406 is not selected (despite being powered on).

Thus, at t0, the bits 404 and 406 are ON (so are other bits not being shown in FIG. 4A). As described above, when a bit (of an SRAM block) is powered on, the bit may present a logic state, which is the initial logic state. In some embodiments, the bits 404 and 406 may present an initial logic state, respectively.

Continuing to time "t1," the power signal 421 remains at low; the pre-charge signal 423 transitions from high to low; the WL signal 427 transitions from low to high. Consequently, using the truth table of OR function in Table 2, the pre-charge control signal 425 (i.e., OR'ing signals 421 and 423) transitions from high to low; the WL assertion signals 429 (i.e., OR'ing signals 421 and 427) transitions from low to high; the WL assertion signal 433 (i.e., OR'ing signals 421 and 431) remains at low. When the pre-charge control signal 425 transitions from high to low, the pre-charge circuit 402 is activated. Accordingly, the pre-charge circuit 402 is configured to pre-charge the BL 403 and BBL 405 to the Vdd (i.e., the supplied voltage 401). When WL assertion signal 429 transitions from low to high, the WL 407 is at high, which means that row a is selected and so are the bits along row a (i.e., bit 404).

Thus, at t1, the initial logic state of bit 404 can be read by the folding circuit 106. More specifically, the initial logic state of bit 404 is read by a logic gate (of the folding circuit) that is coupled to column A of FIG. 4A, and such read initial logic state of bit 404 may be further processed (e.g., OR'd by the logic gate, latched by a corresponding latch unit, provided as one bit of a random number vector 107 by the latch unit), as described above.

Continuing to time "t2," the power signal 421 remains at low; the pre-charge signal 423 transitions from low to high; the WL signal 427 transitions from high to low; the WL signal 431 remains at low. Consequently, using the truth table of OR function in Table 2, the pre-charge control signal 425 (i.e., OR'ing signals 421 and 423) transitions from low to high; the WL assertion signals 429 (i.e., OR'ing signals 421 and 427) transitions from high to low; the WL assertion signal 433 (i.e., OR'ing signals 421 and 431) remains at low. When the pre-charge control signal 425 transitions from low to high, the pre-charge circuit 402 is deactivated again. Accordingly, the pre-charge circuit 402 is configured to decouple the BL 403 and BBL 405 from the Vdd. When WL assertion signal 429 transitions from high to low, the WL 407 is transitions to low again, which means that row a is non-selected and so are the bits along row a (i.e., bit 404). Accordingly, the initial logic state of bit 404 is not able to be read by the folding circuit 106.

Continuing to time "t3," the power signal 421 transitions from low to high; the pre-charge signal 423 remains at high; the WL signals 427 and 431 remain at low. Consequently, using the truth table of OR function in Table 2, the pre-charge control signal 425 (i.e., OR'ing signals 421 and 423) remains at low; the WL assertion signals 429 (i.e., OR'ing signals 421 and 427) transitions from low to high; the WL assertion signal 433 (i.e., OR'ing signals 421 and 431) transitions from low to high. When the power signal 421 transitions from low to high, the first transistor 420 is turned off and the second transistor 422 is turned on. As such, the VSV lines 443 and 445 are decoupled from the Vdd (i.e., power) and coupled to ground. That is, the bits 404 and 406 are powered off. Also, as described above, when the WL assertion signals 429 and 433 are at high, the WL's 407 and 409 are asserted, respectively.

As described above, iteratively performing power cycles on the SRAM block 104 of the tRNG 102 may advantageously increase the randomness level of the tRNG 102' generated random number vector 107. However, due to a presence of one or more parasitic capacitances in the SRAM block 104, a bit of the SRAM block 104 may be powered on again before the bit is being fully discharged (powered off), which may disadvantageously affect the above-mentioned randomness level. More specifically, when the one or more parasitic capacitances are not fully discharged, electric charges present within the parasitic capacitances may disadvantageously flow back to the bits of the SRAM block 104 when the SRAM block 104 is powered on again. The decoupled VSV lines 443 and 445, the deactivated pre-charge circuit 402, and the asserted WL's 407 and 409 (at t3) may assure that the one or more parasitic capacitances are fully discharged during a power-off phase (from t3 to t4) so the disclosed tRNG 102 are not subjected to the above-identified issue. When the VSV lines 443 and 445 are decoupled from the Vdd and coupled to ground, not only are the bits 404 and 406 turned off but also the one or more parasitic capacitances in the SRAM block 104 are discharged. When the pre-charge circuit 402 is deactivated, a conductive path (a leakage path) between the one or more parasitic capacitances in the SRAM block 104 and the Vdd is also disconnected. When the WL's 407 and 409 are asserted (activated), the activated WL may serve as a discharging path for the electric charges present within the parasitic capacitances to be discharged.

Continuing to time "t4," the power signal 421 transitions from high to low; the pre-charge signal 423 remains at high; the WL signals 427 and 431 remain at low. Consequently, using the truth table of OR function in Table 2, the pre-charge control signal 425 (i.e., OR'ing signals 421 and 423) remains at high; the WL assertion signals 429 (i.e., OR'ing signals 421 and 427) transitions from high to low; the WL assertion signal 433 (i.e., OR'ing signals 421 and 431) transitions from high to low. Consequently, the bits 404 and 406 are powered on again but the pre-charge circuit 402, WL's 407 and 409 are deactivated, as similar to t2.

In some embodiments, at t5, the WL signal 431 transitions from low to high and the pre-charge signal 423 transitions from high to low while the power signal 421 remains at low and the WL signal 427 remains at low. As such, the WL assertion signal 433 transitions from low to high, and the pre-charge control signal 425 transitions from high to low, which may cause the pre-charge circuit 402 to pre-charge the BL 403 and BBL 405 and the WL 409 to be asserted, thereby enabling the folding circuit 106 to read the initial logic state present at the bit 406 (and other bits along row b, which are not shown in FIG. 4A).

Figure 5:
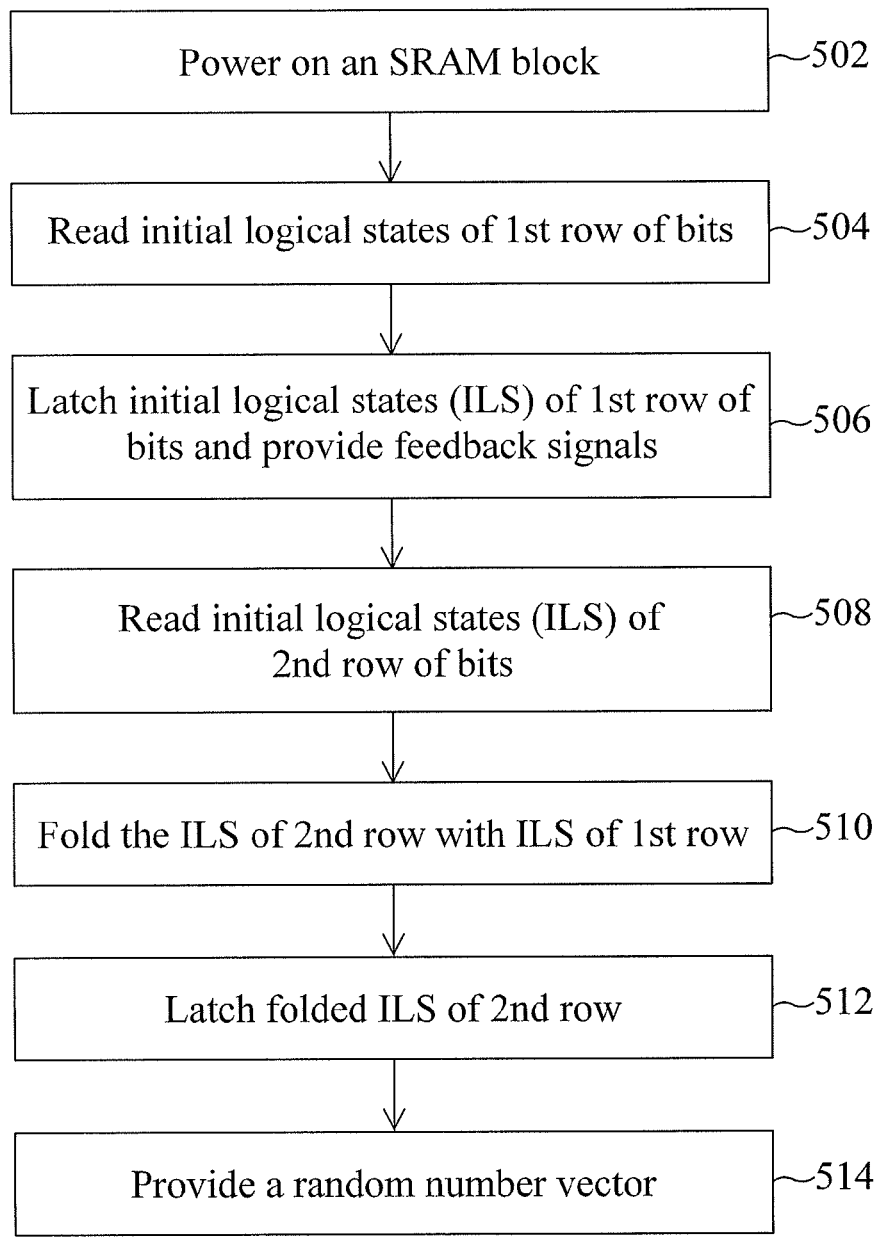
FIG. 5 illustrates a flow chart of a method to generate a random number vector using the tRNG of FIG. 1, in accordance with some embodiments.

FIG. 5 illustrates a flow chart of a method 500 to generate a random number vector by using the disclosed tRNG 102, in accordance with various embodiments. In various embodiments, the operations of method 500 are performed by the respective components illustrated in FIGS. 1-2. For purposes of discussion, the following embodiment of the method 500 will be described in conjunction with FIGS. 1-2. The illustrated embodiment of the method 500 is merely an example. Therefore, it should be understood that any of a variety of operations may be omitted, re-sequenced, and/or added while remaining within the scope of the present disclosure.

The method 500 starts at operation 502 in which the SRAM block 104 is powered on by the start-up circuit 110. In accordance with various embodiments, when the SRAM block 104 is powered on, each bit (105-1, 105-2, 105-3, 105-4, 105-5, 105-6, 105-7, 105-8, 105-9, 105-10, 105-11, 105-12, 105-13, 105-14, 105-15, 105-16, 105-17, 105-18, 105-19, 105-20, 105-21, 105-22, 105-23, 105-24, and 105-25) of the SRAM block 104 presents an initial logic state (either an 1 or a 0). Further, some of the bits present a predictable 1; some of the bits present a predictable 0. This type of bits is referred to as the "stable bit." Some of the bits present an unpredictable initial logic state, that is, sometimes presenting an 1 and sometimes presenting a zero. This type of bits is referred to as the "unstable bit."

The method 500 proceeds to operation 504 in which the logic gates of the folding circuit 106 read the initial logic states of the bits along a first row of the bit array 105. More specifically, each logic gate (150, 152, 154, 156, and 158) of the folding circuit 106 reads the initial logic state of the logic gate's corresponding (coupled) bit along the first row. Using the SRAM block 104 and the folding circuit 106 of FIG. 2 as an example, the initial logic states of bits along row a, 105-1, 105-2, 105-3, 105-4, and 105-5, are respectively read by the logic gates 150, 152, 154, 156, and 158 of the folding circuit 106.

The method 500 proceeds to operation 506 in which the accumulator register 160 of the folding circuit 106 latches the read initial logic states of the bits along the first row as feedback signals to the logic gates of the folding circuit 106. More specifically, each latch unit of the accumulator register 160 latches the initial logic state read by the latch unit's corresponding logic gate as a feedback signal to the latch unit's corresponding logic gate. Continuing with the above example, the latch units 160-1, 160-2, 160-3, 160-4, and 160-5 latch the initial logic states of bits along row a to the logic gates 150, 152, 154, 156, and 158 as feedback signals 151-2, 153-2, 155-2, 157-2, and 159-2, respectively.

The method 500 proceeds to operation 508 in which the logic gates of the folding circuit 106 read initial logic states of the bits along a second row of the bit array 105. Continuing with the above example, the initial logic states of bits along row b, 105-6, 105-7, 105-8, 105-9, and 105-10, are respectively read by the logic gates 150, 152, 154, 156, and 158.

The method 500 proceeds to operation 510 in which the logic gates of the folding circuit 106 respectively fold the initial logic states of bits along row b with the initial logic states of bits along row a using the XOR function. More specifically, each logic gate of the folding circuit 106 XOR's the initial logic state of the logic gate's corresponding bit on row b with the feedback signal received at operation 506 (i.e., the initial logic state of the bit on row a) and provides an XOR'd initial logic state of the logic gate's corresponding bit on row b.

The method 500 proceeds to operation 512 in which the latch units of the folding circuit 160 respectively latch the XOR'd initial logic states of bits along row b to the corresponding logic gates. In some embodiments, the method 500 proceeds to operation 514 in which the latch units 160-1, 160-2, 160-3, 160-4, and 160-5 of the folding circuit 160 provide the XOR'd initial logic states of bits along row b as the random number vector 107. As described above, the random number vector 107 with more random bits can be generated by processing the initial logic states of bits along one or more rows. As such, the method 500 may iteratively route back to the operation 508 (to read the initial logic states of the bits along a further row), through the operations 510 (to XOR the initial logic states of the bits along the further row with the XOR'd initial logic states of bits along the second row) and 512 (to latch the XOR'd initial logic states of the bits along the further row to the logic gates, respectively, for a still further row) until a desired number of random bits is achieved in the random number vector 107.

Figure 6:
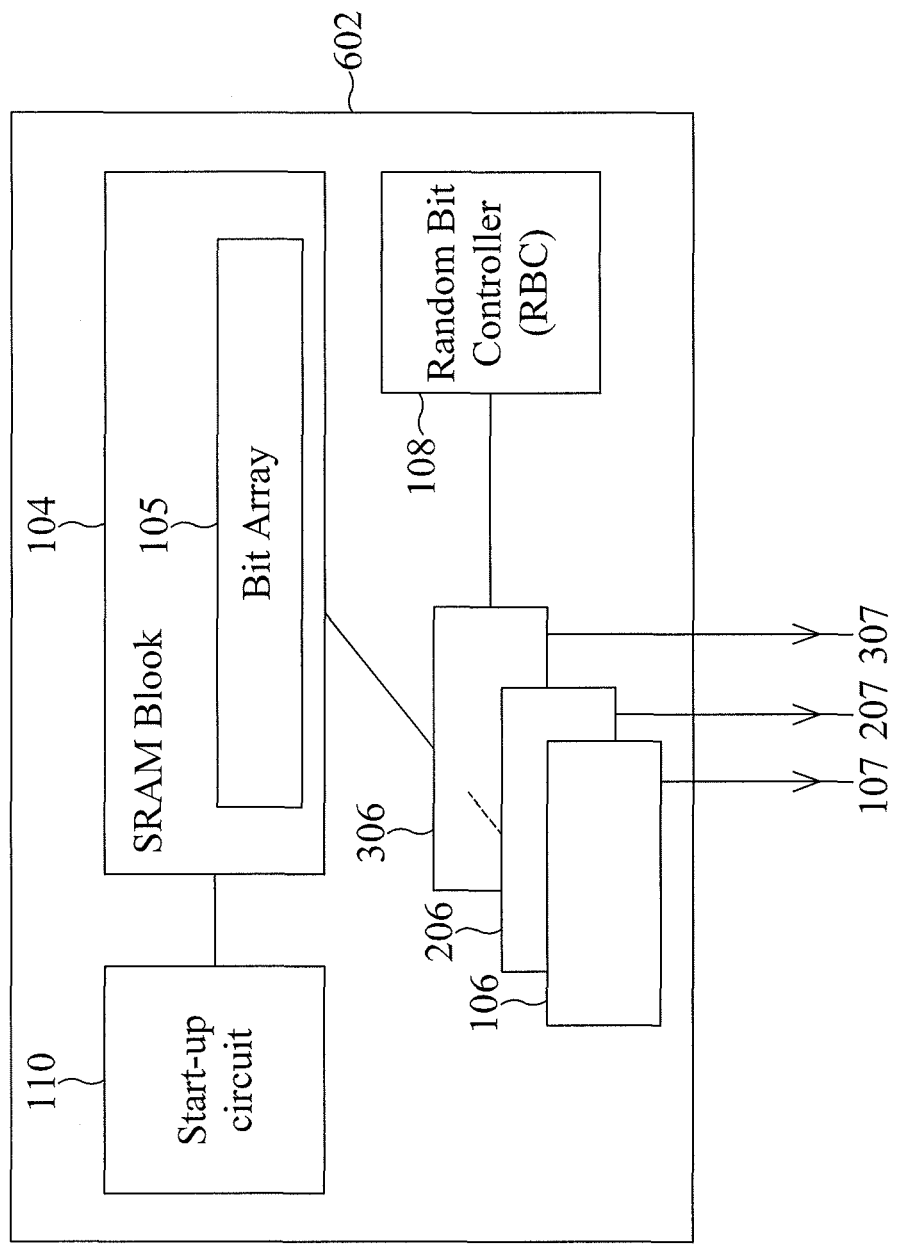
FIG. 6 illustrates an exemplary block diagram of another true random number generator (tRNG) that can concurrently provide two or more random number vectors, in accordance with some embodiments.

FIG. 6 illustrates an exemplary block diagram of another true random number generator (tRNG) 602 that can concurrently provide two or more random number vectors, in accordance with various embodiments. The tRNG 602 is substantially similar to the tRNG 102 except that the tRNG 602 includes additional folding circuits 206 and 306. The folding circuits 206 and 306 are substantially similar to the folding circuit 106. Each of the folding circuits 106, 206, and 306 is coupled to the SRAM block 104 so as to read and process the initial logic states of the bits of the bit array 105, as described above. In this specific embodiment, each of the folding circuits 106, 206, and 306 is configured to read and process the initial logic states of a respective set of bits across the bit array 105, and based on initial logic states of the respective set of bits, to provide a respective random number vector 107, 207, and 307. In an example in which the bit array 105 has 24 rows and 5 columns, the folding circuit 106 may read and process the initial logic states of the bits along rows 1-10 to provide the random number vector 107; the folding circuit 206 may read and process the initial logic states of the bits along rows 11-20 to provide the random number vector 207; the folding circuit 306 may read and process the initial logic states of the bits along rows 21-24 to provide the random number vector 307. In some embodiments, the random number vectors 107, 207, and 307 may be generated by the tRNG 602 simultaneously or sequentially. Although only additional two folding circuits (206 and 306) are shown in the illustrated embodiment of FIG. 6, any desired number of additional folding circuits may be included in the tRNG 602 while remaining within the scope of the present disclosure.

In an embodiment, a random number generator (RNG) is disclosed. The RNG comprises a memory bit array having a plurality of bits, wherein each bit is configured to present an initial logic state when the memory bit array is powered on; and a first folding circuit coupled to the memory bit array, wherein the first folding circuit is configured to: read initial logic states of a first bit and a second bit of the memory bit array, perform a first logic function on the initial logic state of the first bit, and perform a second logic function on the initial logic state of the second bit to contaminate the initial logic state of the second bit so as to provide an altered initial logic state of the second bit.

In another embodiment, a random number generator (RNG) comprises a memory bit array having a plurality of bits, wherein each bit is configured to present an initial logic state when the memory bit array is powered on; and a first folding circuit coupled to the memory bit array, wherein the first folding circuit is configured to: read initial logic state of a first bit disposed on a first row of the memory bit array, read initial logic state of a second bit disposed on a second row of the memory bit array, perform a first logic function on the initial logic state of the first bit, and perform a second logic function on the initial logic state of the second bit to contaminate the initial logic state of the second bit so as to provide an altered initial logic state of the second bit.

Yet in another embodiment, a random number generator (RNG) comprises: a memory bit array having a plurality of bits, wherein each bit is configured to present an initial logical state when the memory bit array is powered on; a first folding circuit coupled to the memory bit array, wherein the first folding circuit is configured to: read initial logic states of a first bit and a second bit of the memory bit array, perform a first logic function on the initial logic state of the first bit, and perform a second logic function on the initial logic state of the second bit to contaminate the initial logic state of the second bit so as to provide an altered initial logic state of the second bit; and a second folding circuit coupled to the memory bit array, wherein the second folding circuit is configured to: read initial logic states of a third bit and a fourth bit of the memory bit array; perform the first logic function on the initial logic state of the third bit, and perform the second logic function on the initial logic state of the fourth bit to contaminate the initial logic state of the fourth bit so as to provide an altered initial logic state of the fourth bit, wherein the first, second, third, and fourth bits are disposed on different rows of the memory bit array, respectively.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A random number generator (RNG), comprising:
   a memory bit array having a plurality of bits, wherein each bit is configured to present an initial logic state when the memory bit array is powered on; and
   a first folding circuit coupled to the memory bit array, wherein the first folding circuit is configured to:
   read initial logic states of a first bit and a second bit of the memory bit array,
   perform a first logic function on the initial logic state of the first bit, and
   perform a second logic function on the initial logic state of the second bit to contaminate the initial logic state of the second bit so as to provide an altered initial logic state of the second bit, wherein the altered initial logic state of the second bit forms a first random bit.

2. The RNG of claim 1, further comprising a start-up circuit, coupled to the memory bit array, and configured to power on the memory bit array.

3. The RNG of claim 1, wherein the first bit is disposed on a first row of the memory bit array and the second bit is disposed on a second row of the memory bit array.

4. The RNG of claim 1, wherein the first folding circuit includes an XOR logic gate coupled to the first and second bits.

5. The RNG of claim 4, wherein the first folding circuit further includes a latch unit that is coupled to the XOR logic gate.

6. The RNG of claim 5, wherein the latch unit includes a D flip flop.

7. The RNG of claim 5, wherein the XOR logic gate is configured to perform the first logic function comprising reading the initial logic state of the first bit and providing the initial logic state of the first bit to the latch unit, the latch unit is configured to latch the initial logic state of the first bit to the XOR logic gate, and the XOR logic gate is configured to perform the first logic function comprising reading the initial logic state of the second bit and performing XOR function on the latched initial logic state of the first bit and the read initial logic state of the second bit so as to provide the altered initial logic state of the second bit.

8. The RNG of claim 7, wherein the latch unit is configured to latch the altered initial logic state of the second bit to the XOR logic gate, the XOR logic gate is configured to read an initial logic state of a third bit on a third row of the memory bit array and perform the XOR function on the latched and altered logic state of the second bit and the read initial logic state of the third bit so as to provide an altered initial logic state of the third bit to the latch unit, the latch unit is configured to latch the altered initial logic state of the third bit to the XOR logic gate and provide the altered initial logic state of the third bit as a further random bit.

9. The RNG of claim 1, further comprising a second folding circuit coupled to the memory bit array, wherein the second folding circuit is configured to read the initial logic states of third and fourth bits of the memory bit array, and perform the second logic function on the initial logic states of the third and fourth bits to contaminate the initial logic state of the fourth bit so as to provide an altered initial logic state of the fourth bit, and wherein the first, second, third, and fourth bits are disposed on different rows of the memory bit array, respectively.

10. The RNG of claim 9, wherein the first random bit formed based on the altered initial logic state of the second bit and a second random bit formed based on the altered initial logic state of the fourth bit are generated concurrently.

11. A random number generator (RNG), comprising:
a memory bit array having a plurality of bits, wherein each bit is configured to present an initial logic state when the memory bit array is powered on; and
a first folding circuit coupled to the memory bit array, wherein the first folding circuit is configured to:
read initial logic state of a first bit disposed on a first row of the memory bit array,
perform a first logic function on the initial logic state of the first bit,
read initial logic state of a second bit disposed on a second row of the memory bit array, and
perform a second logic function on the initial logic state of the second bit to contaminate the initial logic state of the second bit so as to provide an altered initial logic state of the second bit, wherein the altered initial logic state of the second bit forms a first random bit.

12. The RNG of claim 11, further comprising a start-up circuit, coupled to the memory bit array, and configured to power on the memory bit array.

13. The RNG of claim 11, wherein the first folding circuit includes an XOR logic gate coupled to the first and second bits.

14. The RNG of claim 13, wherein the first folding circuit further includes a latch unit that is coupled to the XOR logic gate.

15. The RNG of claim 14, wherein the latch unit includes a D flip flop.

16. The RNG of claim 14, wherein the XOR logic gate is configured to perform the first logic function comprising reading the initial logic state of the first bit and provide the read initial logic state of the first bit to the latch unit, the latch unit is configured to latch the initial logic state of the first bit to the XOR logic gate, and the XOR logic gate is configured to perform the first logic function comprising reading the initial logic state of the second bit and performing an XOR function on the latched initial logic state of the first bit and the read initial logic state of the second bit so as to provide the altered initial logic state of the second bit.

17. The RNG of claim 16, wherein the latch unit is configured to latch the altered initial logic state of the second bit to the XOR logic gate, the XOR logic gate is configured to read an initial logic state of a third bit on a third row of the memory bit array and perform the XOR function on the latched altered logic state of the second bit and the read initial logic state of the third bit so as to provide an altered initial logic state of the third bit to the latch unit, the latch unit is configured to latch the altered initial logic state of the third bit to the XOR logic gate and provide the altered initial logic state of the third bit as a further random bit.

18. A random number generator (RNG), comprising:
a memory bit array having a plurality of bits, wherein each bit is configured to present an initial logic state when the memory bit array is powered on;
a first folding circuit coupled to the memory bit array, wherein the first folding circuit is configured to:
read initial logic states of a first bit and a second bit of the memory bit array,
perform a first logic function on the initial logic state of the first bit, and
perform a second logic function on the initial logic state of the second bit to contaminate the initial logic state of the second bit so as to provide an altered initial logic state of the second bit, wherein the altered initial logic state of the second bit forms a first random bit; and
a second folding circuit coupled to the memory bit array, wherein the second folding circuit is configured to:
read initial logic states of a third bit and a fourth bit of the memory bit array,
perform the first logic function on the initial logic state of the third bit, and
perform the second logic function on the initial logic state of the fourth bit to contaminate the initial logic state of the fourth bit so as to provide an altered initial logic state of the fourth bit, wherein the altered initial logic state of the fourth bit forms a second random bit,
wherein the first, second, third, and fourth bits are disposed on different rows of the memory bit array, respectively.

19. The RNG of claim 18, wherein the first random bit formed based on the altered initial logic state of the second bit and the second random bit formed based on the altered initial logic state of the fourth bit are generated concurrently.

20. The RING of claim 18, wherein the second logic function is an XOR logic function.

* * * * *

UNITED STATES PATENT AND TRADEMARK OFFICE
CERTIFICATE OF CORRECTION

PATENT NO. : 10,019,236 B2
APPLICATION NO. : 15/234842
DATED : July 10, 2018
INVENTOR(S) : Shih-Lien Linus Lu Page 1 of 1

It is certified that error appears in the above-identified patent and that said Letters Patent is hereby corrected as shown below:

In the Claims

Claim 7, Column 20, Line 48, insert -- an -- before "XOR"

Claim 9, Column 20, Line 64, delete "hit" and insert -- bit --

Signed and Sealed this
Twenty-first Day of May, 2019

Andrei Iancu
*Director of the United States Patent and Trademark Office*